United States Patent
Hayashi

(10) Patent No.: US 9,613,781 B2
(45) Date of Patent: Apr. 4, 2017

(54) SCANNING ELECTRON MICROSCOPE

(71) Applicant: HAMAMATSU PHOTONICS K.K., Hamamatsu-shi, Shizuoka (JP)

(72) Inventor: Masahiro Hayashi, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 15/000,305

(22) Filed: Jan. 19, 2016

(65) Prior Publication Data

US 2016/0217972 A1 Jul. 28, 2016

(30) Foreign Application Priority Data

Jan. 23, 2015 (JP) .................... 2015-011089
Jan. 15, 2016 (JP) .................... 2016-005865

(51) Int. Cl.
  *H01J 37/26* (2006.01)
  *H01J 37/28* (2006.01)
  *H01J 37/04* (2006.01)
  *H01J 37/06* (2006.01)

(52) U.S. Cl.
  CPC ............ *H01J 37/28* (2013.01); *H01J 37/04* (2013.01); *H01J 37/06* (2013.01); *H01J 2237/2806* (2013.01)

(58) Field of Classification Search
  USPC ..... 250/306, 307, 309, 310, 311, 396 R, 397
  See application file for complete search history.

(56) References Cited

U.S. PATENT DOCUMENTS

| 4,568,853 | A | 2/1986 | Boutot |
| 6,236,053 | B1 | 5/2001 | Shariv |
| 7,564,043 | B2 | 7/2009 | Hayashi et al. |
| 2004/0061054 | A1* | 4/2004 | Kondo .................. H01J 29/385 250/310 |
| 2008/0116368 | A1* | 5/2008 | Uchiyama ............. H01J 37/244 250/287 |
| 2014/0151549 | A1* | 6/2014 | Steiner .................... H01J 43/30 250/288 |
| 2015/0034822 | A1* | 2/2015 | Reinhorn ............. H01J 37/244 250/307 |

FOREIGN PATENT DOCUMENTS

JP 2007-042513 A 2/2007

* cited by examiner

*Primary Examiner* — Nicole Ippolito
(74) *Attorney, Agent, or Firm* — Drinker Biddle & Reath LLP

(57) ABSTRACT

An embodiment of the invention relates to a SEM enabling a surface analysis of a sample at a high throughput. The SEM has an electron gun, an irradiation unit, and a detector. The detector, as a first structure, includes an MCP, an anode, and a dynode. The dynode is set at a potential higher than a potential of an output face of the MCP and the anode is set at a potential higher than that of the dynode. The anode is disposed on the dynode side with respect to an intermediate position between the output face of the MCP and the dynode. The anode has an aperture for letting electrons from the output face of the MCP pass toward the dynode.

8 Claims, 9 Drawing Sheets

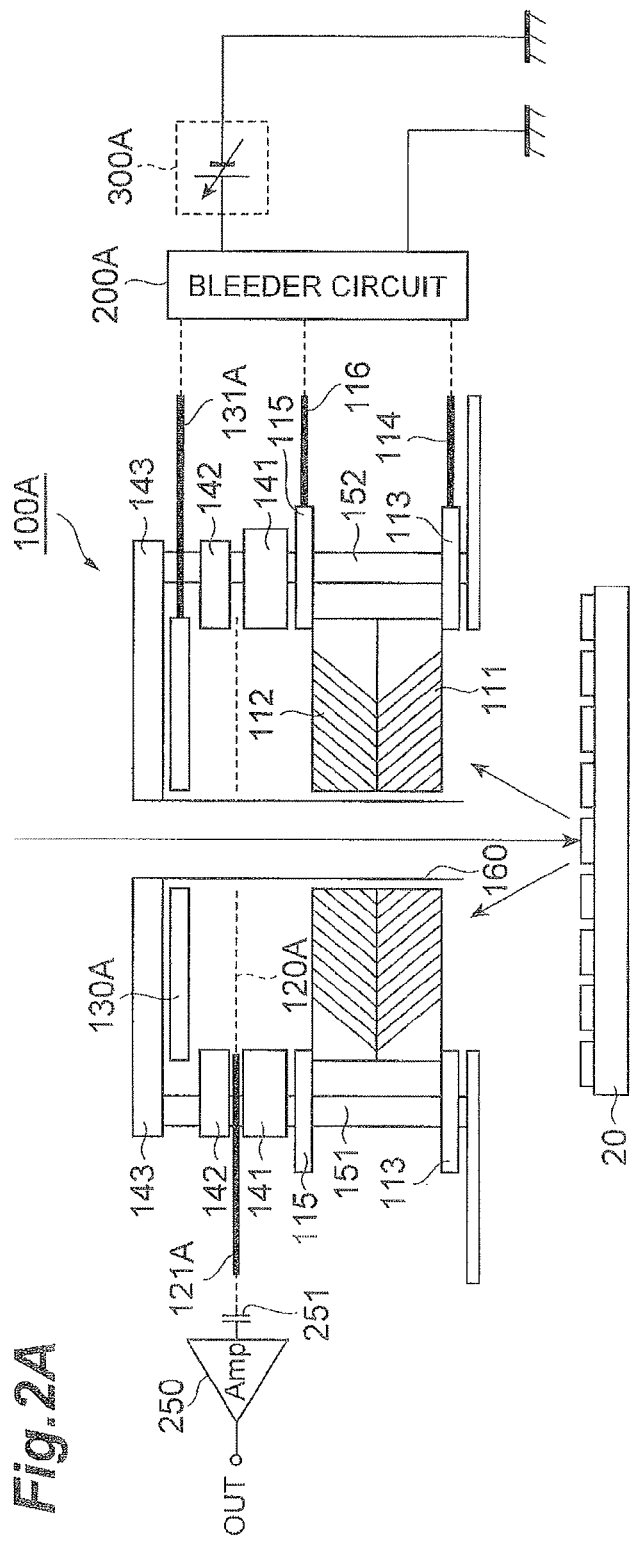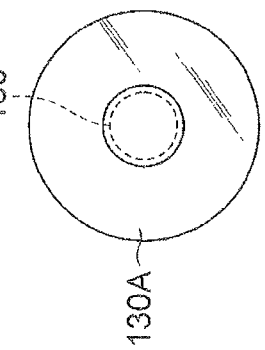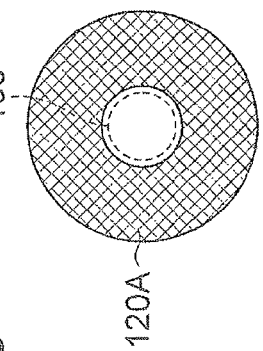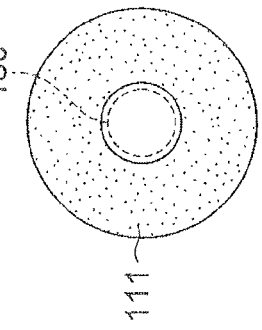

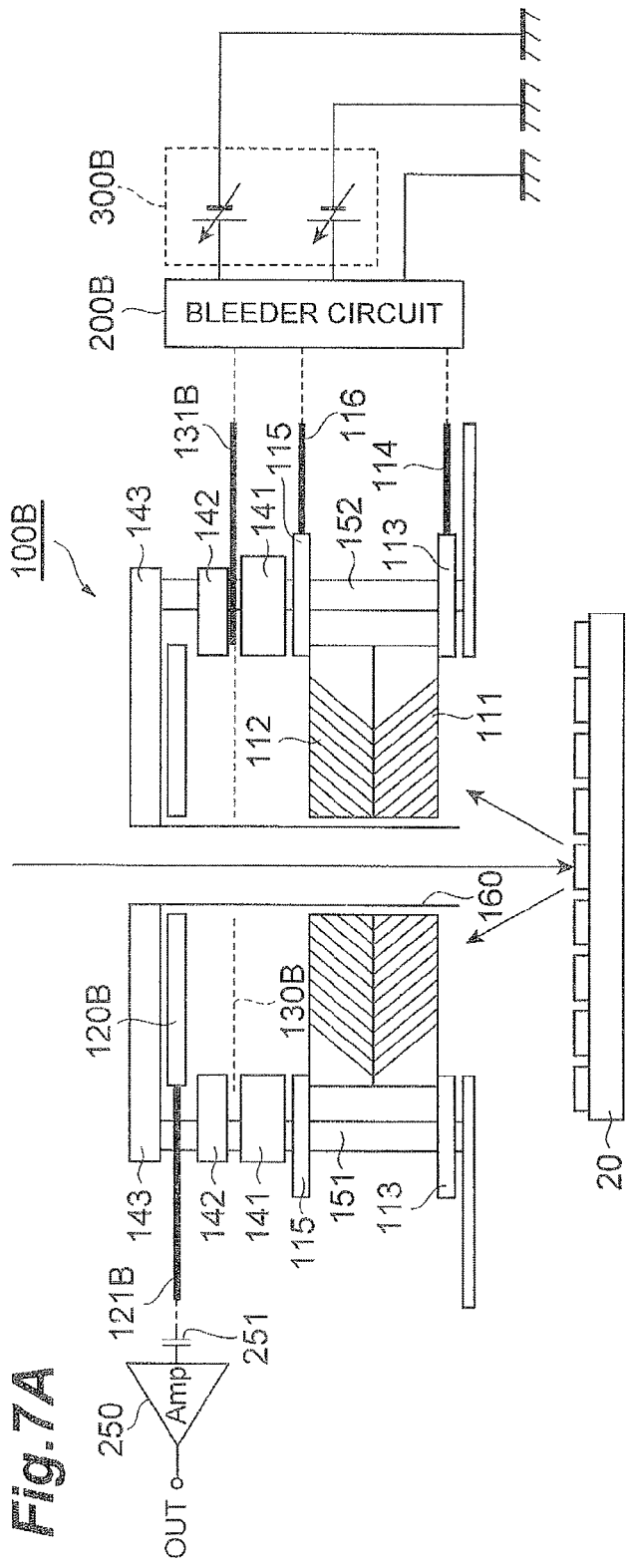
Fig.7A
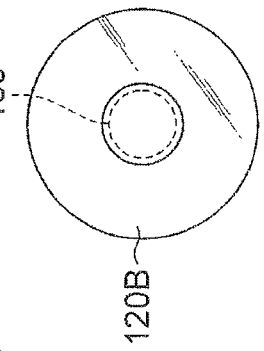
Fig.7D
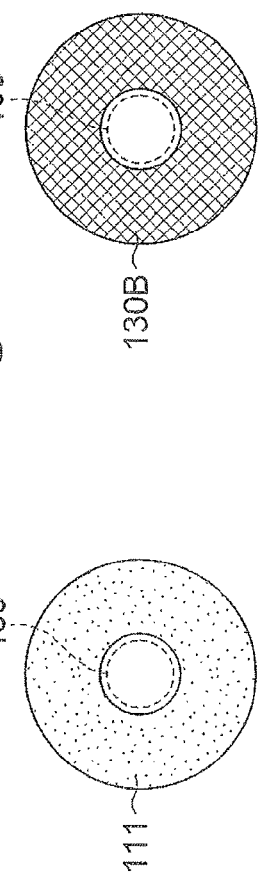
Fig.7C
Fig.7B

SCANNING ELECTRON MICROSCOPE

TECHNICAL FIELD

The present invention relates to a Scanning Electron Microscope (hereinafter referred to as "SEM").

BACKGROUND

For example, the SEM described in Japanese Unexamined Patent Publication No. 2007-42513 (Patent Literature 1) is configured to scan a sample by irradiating the sample with a narrowly-focused electron beam as probe and moving the position of irradiation with the electron beam, and to detect electrons (secondary electrons or reflected electrons) generated at each position of the sample in accordance with the irradiation with the electron beam, by a detector. The SEM can perform a surface analysis of the sample by such electron detection. SEM has the feature of larger magnifying powers than optical microscopes and is indispensable as apparatus for visualizing nanoscale microstructures, e.g., for inspection of semiconductor mask patterns.

When a sample is irradiated with the electron beam, the sample generates secondary electrons or reflected electrons. The secondary electrons are electrons generated from near the surface of the sample. An image obtained by detection of secondary electrons (secondary electron image) reflects microscopic unevenness of the sample. The reflected electrons are electrons recoiling upon collision with atoms constituting the sample. Since the number of reflected electrons depends on a composition of the sample (an average atomic number, crystallographic orientation, or the like), an image obtained by detection of reflected electrons (reflected electron image) reflects a composition distribution of the sample. The surface analysis of the sample can be implemented based on the secondary electron image or the reflected electron image.

Since the probe used in SEM is the electron beam, it is not difficult to increase or decrease an electron dose of the electron beam irradiating the surface of the sample. On the other hand, in measuring an insulator sample or the like, a charging phenomenon occurs, resulting in degradation of image quality. For this reason, SEM has been used heretofore while adopting countermeasures such as limitation of the incident electron amount or a quenching gas for prevention of charging.

SUMMARY

The Inventors conducted detailed research on the conventional SEMs and found the problem as described below. Namely, increase in gain of the secondary electron detector becomes important as means for gaining high quality (high S/N), with decrease in incident electrons and suppression of noise. With miniaturization of semiconductor mask patterns and development of nanoimprint technology, SEM is needed in recent years to achieve a higher throughput to process measurement of microscopic pattern at high speed. For meeting this need, there is an attempt to decrease the diameter of the electron beam and sweep the probe at high speed, thereby increasing the measurement speed. As a result, a great burden is imposed on the secondary electron detector and the performance of the detector is becoming a bottle neck to achievement of a higher throughput.

SEM uses the detector including a Micro-Channel Plate (hereinafter referred to as "MCP"). MCP has characteristics such as small size, light weight, high gain, and being little affected by a magnetic field; therefore, MCP is commonly used as a secondary electron detector for Critical Dimension-Scanning Electron Microscope (CD-SEM) or the like. In the present specification, the secondary electrons generated from near the surface of the sample will be simply referred to as "electrons," in order to discriminate the secondary electrons or reflected electrons generated from near the surface of the sample and reaching an input face of an MCP from secondary electrons multiplied in the MCP and outputted from an output face of the MCP.

Detectors used in SEM include semiconductor detectors and photomultipliers as well as MCP. For detecting secondary electrons with low energy, however, it is necessary to adopt a layout wherein the detector is set as close to the sample surface as possible, without disturbance of an electromagnetic field of a SEM cylinder. The detectors except for MCP have to be installed at a position distant from the sample surface because of restrictions of physical structure and, for this reason, addition of an acceleration electric filed is needed to collect secondary electrons with low energy, so as to make design of the electromagnetic field complicated. This is one of big reasons for use of MCP as a detector of SEM.

On the other hand, the conventional SEMs using the MCP detector had unsatisfactory throughputs and there are desires for achievement of a higher throughput.

The present invention has been accomplished in order to solve the above-described problem and it is an object of the present invention to provide a scanning electron microscope (SEM) with a structure for enabling the surface analysis of the sample at a high throughput.

A SEM (scanning electron microscope) according to an embodiment of the invention has an electron gun, an irradiation unit, and a detector. The electron gun generates an electron beam. The irradiation unit irradiates a sample with the electron beam while scanning the sample by moving a position of irradiation with the electron beam on the sample. The detector detects electrons generated from the sample in accordance with the irradiation of the sample with the electron beam. Particularly, the detector has a first structure comprised of an MCP (micro-channel plate) for multiplying secondary electrons generated in accordance with incidence of the electrons generated from the sample, a dynode, and an anode, or, a second structure comprised of an MCP, an anode, and an electrode.

In the detector having the first structure, the MCP has an input face located at a position of arrival of the electrons from the sample, and an output face opposing the input face. The multiplied secondary electrons are outputted from the output face. The dynode is disposed on the opposite side to the input face of the MCP with respect to the output face of the MCP and multiplies the secondary electrons outputted from the output face of the MCP. The dynode is set at a potential higher than a potential of the output face of the MCP. The anode is disposed in a space from the dynode to an intermediate position between the output face of the MCP and the dynode, in order to collect the secondary electrons multiplied by the dynode. The anode has an aperture for letting the secondary electrons outputted from the output face of the MCP, pass toward the dynode. Furthermore, the anode is set at a potential higher than the potential of the dynode.

On the other hand, in the detector having the second structure, the MCP has an input face located at a position of arrival of the electrons from the sample, and an output face opposing the input face. The multiplied secondary electrons are outputted from the output face. The anode is disposed on the opposite side to the input face of the MCP with respect to the output face of the MCP, in order to collect the secondary electrons outputted from the output face of the MCP. The anode is set at a potential higher than a potential of the output face of the MCP. The electrode is disposed in a space from the anode to an intermediate position between the output face of the MCP and the anode. This electrode has an aperture for letting the secondary electrons outputted from the output face of the MCP, pass toward the anode. Furthermore, this electrode is set at a potential higher than the potential of the anode.

Each of embodiments according to the present invention will become more fully understood from the detailed description given hereinbelow and the accompanying drawings. These examples are presented by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, and it is apparent that various modifications and improvements within the scope of the invention would be obvious to those skilled in the art from this detailed description.

BRIEF DESCRIPTION OF THE DRAWINGS

FIG. 2A is a drawing showing a cross-sectional structure of the detector having the first structure; FIG. 2B is a plain view of a MCP laminate; FIG. 2C is a plain view of an anode; and FIG. 2D is a plain view of a dynode.

FIG. 7A is a drawing showing a cross-sectional structure of the detector having the second structure; FIG. 7B is a plain view of a MCP laminate; FIG. 7C is a plain view of an anode; and FIG. 7D is a plain view of a dynode.

DETAILED DESCRIPTION

Description of Embodiment of Invention

Figure 1:
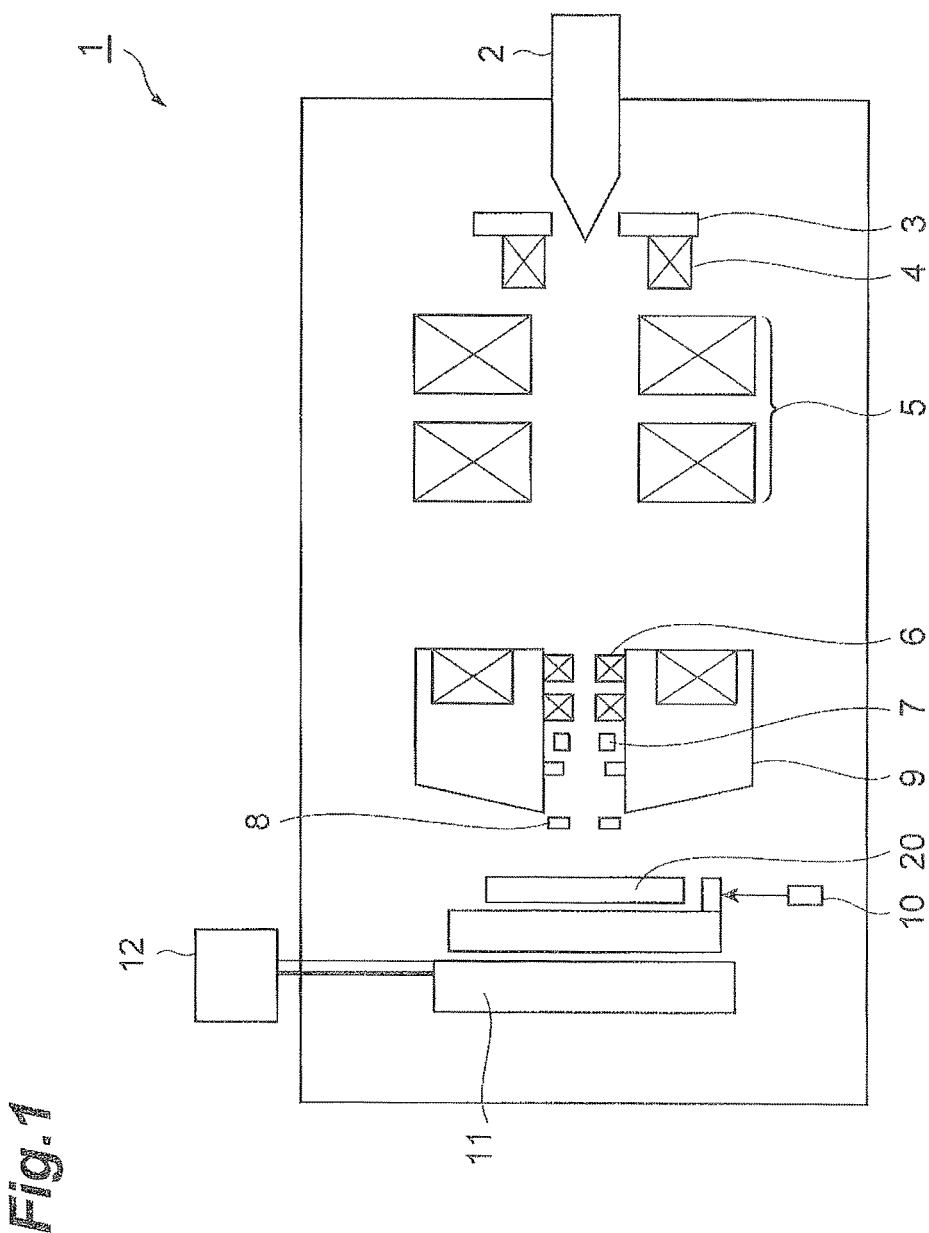
FIG. 1 is a drawing showing a schematic configuration of the SEM (scanning electron microscope) according to the first embodiment.

First, the contents of the embodiment of the invention will be described each as individually enumerated below.

(1) A SEM (scanning electron microscope) according to the embodiment of the invention has an electron gun, an irradiation unit, and a detector. The electron gun generates an electron beam. The irradiation unit irradiates a sample with the electron beam while scanning the sample by moving a position of irradiation with the electron beam on the sample. The detector detects electrons generated from the sample in accordance with the irradiation of the sample with the electron beam. Particularly, the detector has a first structure comprised of an MCP (micro-channel plate) for multiplying secondary electrons generated in accordance with incidence of the electrons generated from the sample, a dynode, and an anode, or, a second structure comprised of an MCP, an anode, and an electrode.

In the detector having the first structure, the MCP has an input face located at a position of arrival of the electrons from the sample, and an output face opposing the input face. The multiplied secondary electrons are outputted from the output face. The dynode is disposed on the opposite side to the input face of the MCP with respect to the output face of the MCP and multiplies the secondary electrons outputted from the output face of the MCP. The dynode is set at a potential higher than a potential of the output face of the MCP. The anode is disposed in a space from the dynode to an intermediate position between the output face of the MCP and the dynode, in order to collect the secondary electrons multiplied by the dynode. The anode has an aperture for letting the secondary electrons outputted from the output face of the MCP, pass toward the dynode. Furthermore, the anode is set at a potential higher than the potential of the dynode.

On the other hand, in the detector having the second structure, the MCP has an input face located at a position of arrival of the electrons from the sample, and an output face opposing the input face. The multiplied secondary electrons are outputted from the output face. The anode is disposed on the opposite side to the input face of the MCP with respect to the output face of the MCP, in order to collect the secondary electrons outputted from the output face of the MCP. The anode is set at a potential higher than a potential of the output face of the MCP. The electrode is disposed in a space from the anode to an intermediate position between the output face of the MCP and the anode. This electrode has an aperture for letting the secondary electrons outputted from the output face of the MCP, pass toward the anode. Furthermore, this electrode is set at a potential higher than the potential of the anode.

(2) In the detector having the first structure, as one aspect of the embodiment, an aperture rate of the anode is preferably not more than 90%. As one aspect of the embodiment, the anode preferably has a plurality of apertures arranged two-dimensionally. Furthermore, as one aspect of the embodiment, the dynode is preferably comprised of a metal flat plate coated with a film to increase a secondary electron emission efficiency.

(3) On the other hand, in the detector having the second structure, as one aspect of the embodiment, an aperture rate of the electrode is preferably not more than 90%. As one aspect of the embodiment, the electrode preferably has a plurality of apertures arranged two-dimensionally. As one aspect of the embodiment, the anode is preferably comprised of a metal flat plate.

Each of the aspects enumerated in this [Description of Embodiment of Invention] above is applicable to each of all the remaining aspects or to all combinations of these remaining aspects.

Details of Embodiment of Invention

Specific examples of the SEM according to the present invention will be described below in detail with reference to the accompanying drawings. It should be noted that the present invention is by no means intended to be limited to these examples presented by way of illustration but is intended for inclusion of all changes within the meaning and scope of equivalence to the scope of claims, as described in the scope of claims. The same elements will be denoted by the same reference signs in the description of the drawings, without redundant description.

First described is how we have accomplished the present invention. The MCP used as a detector in the SEM is a secondary electron multiplier having a structure with a plurality of micro-channels arranged two-dimensionally and independently of each other. The MCP has an output face set at a higher potential than an input face whereby it can multiply electrons. Specifically, when a charged particle collides with an inner wall face of each channel, secondary electrons are emitted therefrom and the electrons are accelerated by a potential gradient to collide with the inner wall face of the channel. This process is repeated in each channel, whereby a large number of multiplied electrons are outputted from the output face.

The electron multiplication function of MCP is restricted when the inner wall of each channel is saturated with charge. For restraining this charge saturation, it is effective to supply electrons by strip current flowing in the channel wall. There was the conventional attempt to increase the strip current by reduction in resistance of the MCP. Expansion of the linear range (linearity) of extracted charge by reduction in resistance of the MCP is an effective means. On the other hand, however, the MCP resistance has a negative temperature coefficient and the MCP is used in a high vacuum where radiation of heat is difficult; for this reason, it has the problem that generation of heat by the strip current in the MCP itself can cause warming and discharge phenomena. Since the MCP detector used in the existing SEMs is implemented with full resistance reduction measures, it is practically difficult to further reduce the resistance.

The multiplication rate (gain) of about $10^5$ to $10^6$ is needed for converting an electron with only the elementary charge of monovalence into an electric signal by the detector and for discriminating the electric signal from noise. The gain is essential to achievement of high S/N. If the number of secondary electrons incident into the detector within a fixed time largely increases in order to meet the need for achievement of a higher throughput, while the scanning distance becomes longer with narrow focusing of the electron beam irradiating the sample, S/N will become lower due to the phenomenon of exceeding the upper limit of linearity of MCP. Namely, because of the upper limit of linearity determined by the MCP resistance, the maximum amount of incident electrons and the gain have a trade-off relation (as expressed by Expression (1) below).

(Upper limit of linearity of MCP)=(maximum amount of incident electrons)×(gain)  (1)

The present invention provides the SEM capable of performing the surface analysis of the sample at a high throughput, based on the Inventors' research as described above, and, particularly, is characterized by the configuration of the detector. An embodiment of the SEM of the present invention will be described below.

FIG. 1 is a drawing showing a schematic configuration of the scanning electron microscope (SEM) 1 according to the embodiment of the invention. The SEM 1 has an electron gun 2, an anode 3, an alignment coil 4, a condenser lens 5, a deflection scanning coil 6, a reflected electron detector 7, a secondary electron detector 8, an objective 9, a laser interferometer 10, a stage 11, and a motor 12, in a vacuum housing. Among these, the alignment coil 4, condenser lens 5, deflection scanning coil 6, and objective 9 constitute an irradiation unit for scanning a sample 20 by irradiating the sample 20 with an electron beam and moving the position of irradiation with the electron beam on the sample 20.

The electron gun 2 generates the electron beam. The election gun 2 is comprised, for example, of a tungsten wire. The tip of the tungsten wire is so shaped as to be sharp and have a predetermined face, and the electron gun 2 processed in this shape generates the electron beam with application of a high voltage thereto relative to the anode 3. With application of the high voltage to the electron gun 2, the anode 3 accelerates electrons emitted from the electron gun 2. The alignment coil 4 deflects the electron beam emitted from the electron gun 2 so as to implement alignment. The condenser lens 5 focuses the electron beam emitted from the electron gun 2. The deflection scanning coil 6 implements X-directional and Y-directional scanning with the electron beam impinging upon the sample 20.

The reflected electron detector 7 detects reflected electrons generated in the sample 20 upon irradiation of the sample 20 with the electron beam. The reflected electron detector 7 has a circular disk shape with a hole in its center for letting the electron beam pass, which has, for example, four sectors obtained by quartering the entire circumference, so that it can obtain a reflected electron image with density differences depending upon the numbers of electrons based on the sum of signals from the four quartered sectors or so that it can provide highlighted display of unevenness of shape based on difference between two right and left signals. The secondary electron detector 8 performs collection, detection, and amplification of secondary electrons generated in the sample 20 upon irradiation of the sample 20 with the electron beam. The secondary electron detector 8 has a circular disk shape with a hole in its center for letting the electron beam pass. A secondary electron image can be obtained based on a signal detected by the secondary electron detector 8.

The objective 9 narrowly focuses the electron beam on the surface of the sample 20. The laser interferometer 10 measures the position of the stage 11 by making a laser beam outputted toward a reflector attached to the stage 11 interfere with a laser beam reflected by the reflector. The stage 11 is a device on which the sample 20 is mounted and which accurately moves the sample 20 to an arbitrary coordinate position, and is driven by the motor 12. The motor 12 is a power supply for driving the stage 11 in X- and Y-directions, and examples thereof suitably applicable herein include a servo motor, an ultrasonic motor, and so on.

Figure 3A:
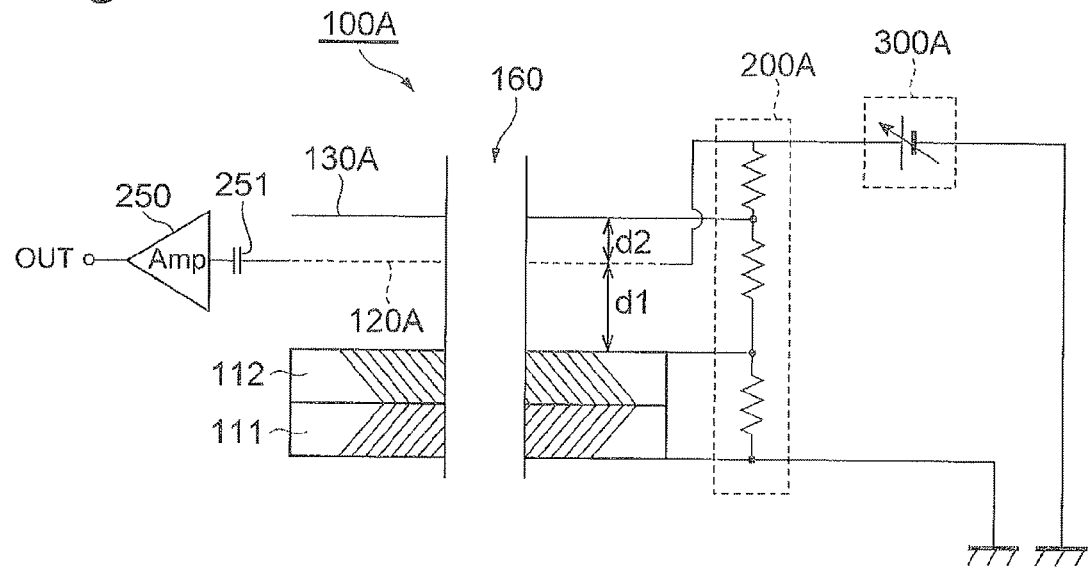
FIG. 3A and FIG. 3B are drawings showing a specific structure for setting electrodes in the detector (first structure) shown in FIG. 2A, at respective predetermined potentials and a potential setting state at each of the electrodes.

FIGS. 2A and 3A are drawings showing a configuration of a detector 100A applicable to the SEM shown in FIG. 1. This detector 100A is applicable to the secondary electron detector in FIG. 1. The detector 100A may be applicable to the reflected electron detector 8. The detector 100A includes, as a first structure, a laminate consisting of MCP 111 and MCP 112 (hereinafter referred to as "MCP laminate"), an anode 120A, a dynode 130A, and a bleeder circuit 200A connected to an external power supply 300A. The bleeder circuit 200A applies predetermined voltages to respective electrodes, for forming a potential gradient as in the example shown in FIG. 3B.

In the detector 100A having this first structure, each of the MCPs 111, 112 is a secondary electron multiplier having the structure with a plurality of micro-channels arranged two-dimensionally and independently of each other. Each channel has the inner diameter of about 10 μm and is inclined at about 10° relative to a normal direction (coincident with a direction of incidence of electrons) to an input face of the MCP laminate (hereinafter referred to as "MCP input face"). It is noted, however, that the inclination direction of each channel in the MCP 111 is different from that in the MCP 112. A lead wire 114 extending from the bleeder circuit 200A is connected through an in electrode (hereinafter referred to as "MCP-IN electrode") 113 to the MCP input face. Similarly, a lead wire 116 extending from the bleeder circuit 200A is connected through an out electrode (hereinafter referred to as "MCP-OUT electrode") 115 to an output face of the MCP laminate (hereinafter referred to as "MCP output face"). Namely, the bleeder circuit 200A applies the predetermined voltages to the respective MCP-IN electrode 113 and MCP-OUT electrode 115 through the lead wires 114, 116, whereby the MCP input face and the MCP output face are set at the respective predetermined potentials. The output face is set at the potential higher than that of the input face, whereby the MCP laminate multiplies secondary electrons generated in accordance with arrival of secondary electrons at the input face and outputs the multiplied electrons from the output face.

The dynode 130A is disposed on the side where the MCP output face lies (or on the opposite side to the MCP input face with respect to the MCP output face) and is configured to multiply the secondary electrons outputted from the MCP output face. The bleeder circuit 200A is connected through a lead wire 131A to the dynode 130A and, the bleeder circuit 200A applies the predetermined voltage to the dynode 130A whereby the dynode 130A is set at the potential higher than that of the MCP output face. The dynode 130A is a metal flat plate (e.g., a SUS flat plate) arranged in parallel to the MCP output face. The dynode 130A is preferably configured so that a surface of the metal flat plate (the face facing the MCP output face) is coated with a high-δ film (a film with a high secondary electron emission efficiency). The high-δ film is, for example, an alkali metal film, which is preferably an $MgF_2$ film.

The anode 120A is disposed in parallel to the MCP output face, in a space from the dynode 130A to an intermediate position between the MCP output face and the dynode 130A. The anode 120A may be located at the intermediate position between the MCP output face and the dynode 130A. The anode 120A has an aperture for letting the secondary electrons outputted from the MCP output face, pass toward the dynode 130A. The anode 120A is connected to a lead wire 121A and the electric pulse signal outputted from the anode 120A is amplified by an amplifier (Amp) 250. The condenser 251 is disposed between the anode 120A and the amplifier 250, and the condenser 251 has a function keeping a signal output level at the GND level by insulating the output thereof. The anode 120A is set at the potential higher than that of the dynode 130A and is configured to collect the secondary electrons multiplied by the dynode 130A. An aperture rate of the anode 120A is preferably not more than 90%. Furthermore, the anode 120A is preferably configured in a mesh shape with a plurality of apertures arranged two-dimensionally.

A through hole is provided in each central region of the MCP laminate (FIG. 2B), the anode 120A (FIG. 2C), and the dynode 130. A (FIG. 2D), and then these through holes are inserted with the tube member 160. The electron beam to be incident to the sample 20 passes through an inner space of the tube member 160.

The anode 120A is sandwiched between a ceramic plate 141 and a ceramic plate 142. The dynode 130A is sandwiched between the ceramic plate 142 and a ceramic plate 143. Each of the MCP-IN electrode 113, MCP-OUT electrode 115, and ceramic plates 141-143 has an annular shape. A relative positional relationship among the MCP-IN electrode 113, MCP-OUT electrode 115, and ceramic plates 141-143 is fixed with screws 151, 152, thereby assembling the detector 100A having the first structure.

In this detector 100A, the anode 120A and dynode 130A are arranged in order along the direction from the MCP input face to the MCP output face. The bleeder circuit 200A applies the predetermined voltages to these respective electrodes through the lead wires 114 (the GND potential in the example in FIGS. 2A, 3A, and 3B), 116, 121A, and 131A so that the potential of the dynode 130A is higher than the potential of the MCP output face and so that the potential of the anode 120 A is higher than the potential of the dynode 130A. When an electron arrives at the MCP input face, secondary electrons generated in response to the arrival of the electron are multiplied in the MCPs 111, 112. A large number of secondary electrons thus multiplied are outputted from the MCP output face. Most of the large number of secondary electrons outputted from the MCP output face pass through the aperture of the anode 120A to collide with the dynode 130A and this collision causes the dynode 130A to generate a larger number of secondary electrons. The anode 120A collects the larger number of secondary electrons generated by the dynode 130A. Namely, when electrons arrive at the MCP input face, the anode 120A outputs the electric pulse signal having a crest value depending on the number of electrons.

Figure 3B:
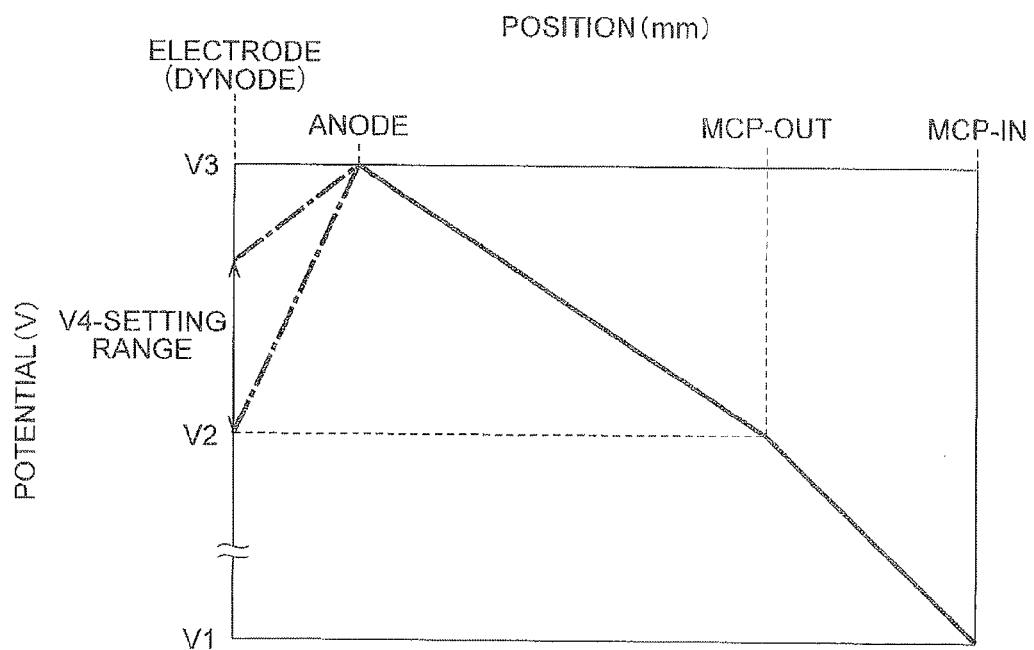

In an example of the potential gradient shown in FIG. 3B, the potential V1 of the MCP input face (MCP-IN electrode 113) is set at 0V (GND potential), the potential V2 of the MCP output face (MCP-OUT electrode 115) is set at +2000V, the potential V3 of the anode 120A is set at +2500V, and the potential V4 of the dynode 130A is set at a positive potential in the range (V4-setting range) of from V2 to V3. Regarding the potential gradient from MCP-IN electrode 113 to the anode 120A, as described in the following experimental example, the potential V3 of the anode 120A may be set at 0V (GND potential). In this case, as an example, the potential V1 of the MCP-IN electrode 113 is set at −2500V, the potential V2 of the MCP-OUT electrode 115 is set at −500V, the potential V3 of the anode 120A is set at 0V (GND potential), and the potential V4 of the dynode 130A is set at a negative potential in the range (V4-setting range) of from V2 to V3.

Figure 4:
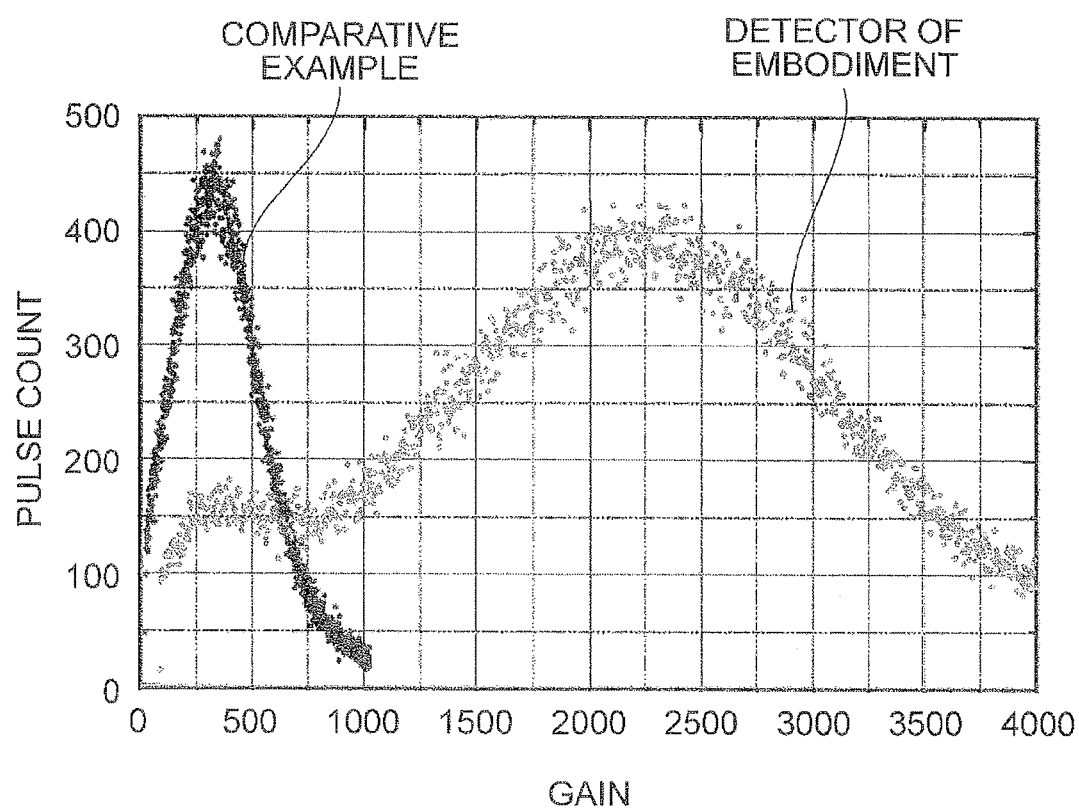
FIG. 4 is a graph showing a gain characteristic of the detector (first structure) shown in FIG. 2A.

FIG. 4 is a graph showing a gain characteristic of the detector 100A. The horizontal axis represents the gain and the vertical axis the pulse count of electrons outputted from the MCP output face. In both of the detector 100A with the first structure and a comparative example, the distance between the MCP output face and the anode 120A was 1 mm and the distance between the anode 120A and the dynode 130A 1 mm. The dynode 130A was a SUS plate coated with an $MgF_2$ film. The potential V1 of the MCP input face was −2500V, the potential V2 of the MCP output face −500V, and the potential V3 of the anode 120A 0V (GND potential). In the comparative example, the potential V4 of the dynode 130A was set at 0V (GND potential) and the anode 120A and dynode 130A were bundled so as to detect all the secondary electrons outputted from the MCP. In the detector 100A applied to the present embodiment, secondary electrons were detected by the anode 120A while the potential V4 of the dynode 130A was set at −250V.

As can be seen from FIG. 4, the gain of the detector 100A was approximately 6.3 times the gain of the comparative example. A sub-peak is recognized at the position of the gain peak of the comparative example in the gain characteristic of the detector 100A, and this indicates that some of the large number of secondary electrons outputted from the MCP output face are directly captured by the anode 120A without reaching the dynode 130A. In the description hereinbelow, a ratio of the gain of the detector 100A (where the potential V3 of the anode 120A is set higher than the potential V4 of the dynode 130A) to the gain of the comparative example (where the anode 120A and dynode 130A are bundled so as to set the anode 120A and dynode 130A at the same potential) will be referred to as "relative gain."

Figure 5:
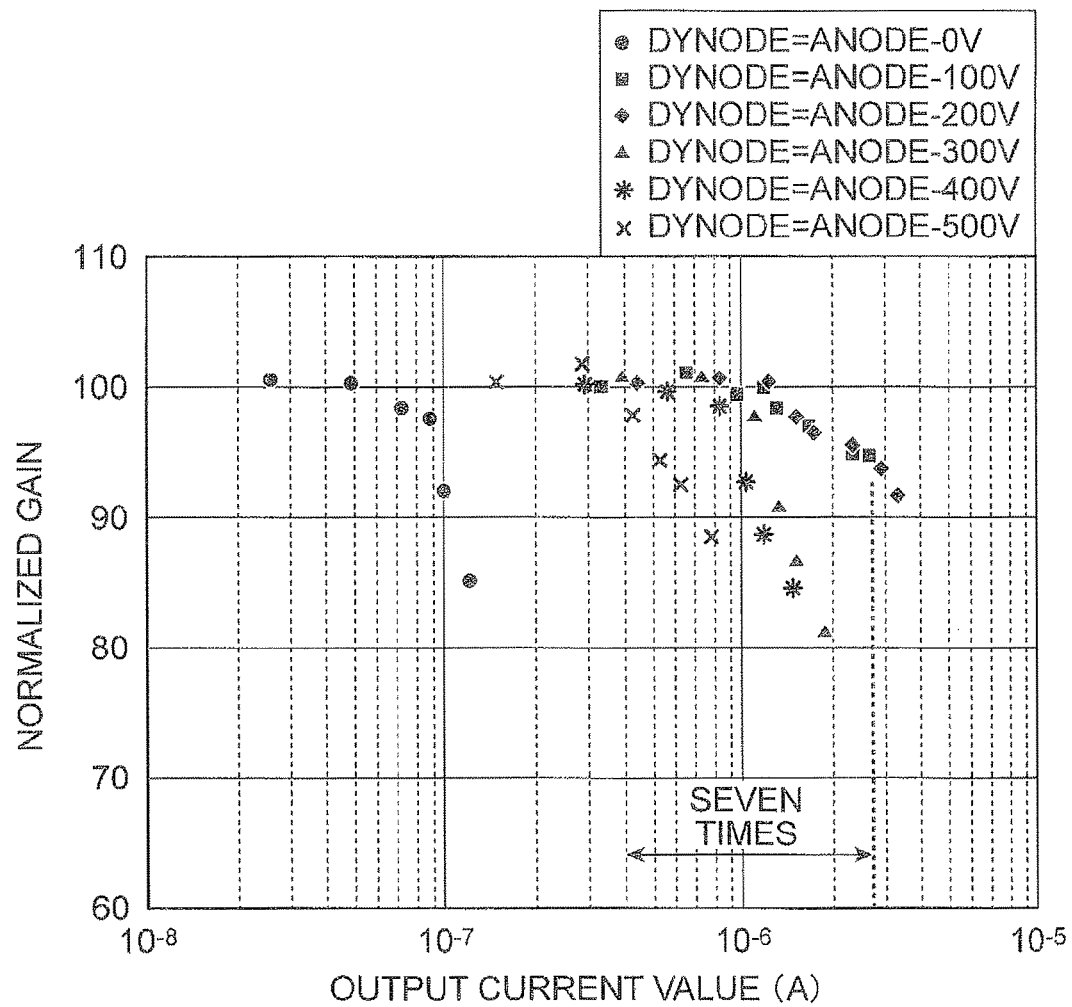
FIG. 5 is a graph showing linearity characteristics of the detector (first structure) shown in FIG. 2A.

FIG. 5 is a graph showing linearity characteristics of the detector 100A. The horizontal axis represents the output current value (A) from the anode 120A and the vertical axis the normalized gain. The normalized gain is defined as 100 for the gain at small output current values. In FIG. 5, mark "●" indicates the linearity characteristic with the potential V4 of the dynode 130A set at the same potential as the potential V3 of the anode 120A, mark "■" the linearity characteristic with the potential V4 of the dynode 130A set at −100V with respect to the potential V3 of the anode 120A, mark "♦" the linearity characteristic with the potential V4 of the dynode 130A set at −200V with respect to the potential V3 of the anode 120A, mark "▲" the linearity characteristic with the potential V4 of the dynode 130A set at −300V with respect to the potential V3 of the anode 120A, combined mark of "*" and "−" the linearity characteristic with the potential V4 of the dynode 130A set at −400V with respect to the potential V3 of the anode 120A, and mark "×" the linearity characteristic with the potential V4 of the dynode 130A set at −500V with respect to the potential V3 of the anode 120A. In both of the detector 100A and the comparative example used in this measurement, the distance between the MCP output face and the anode 120A was 1 mm and the distance between the anode 120A and the dynode 130A 1 mm. The dynode 130A was a SUS plate coated with an $MgF_2$ film. The potential V1 of the MCP input face was set at −2500V the potential V2 of the MCP output face at −500V, and the potential V3 of the anode 120A at 0V (GNU potential). In the comparative example, the potential V4 of the dynode 130A was set at 0V and the dynode 130A and anode 120A were bundled. As can be seen from FIG. 5, the DC linearity of the detector 100A with the potential V4 of the dynode 130A set at −200V with respect to the potential V3 of the anode 120A, was expanded to approximately seven times that of the comparative example.

It is understood from FIGS. 4 and 5 that in the detector 100A applied to the present embodiment the linearity is also expanded by the degree of multiplication of the gain with respect to the comparative example.

Figure 6A:
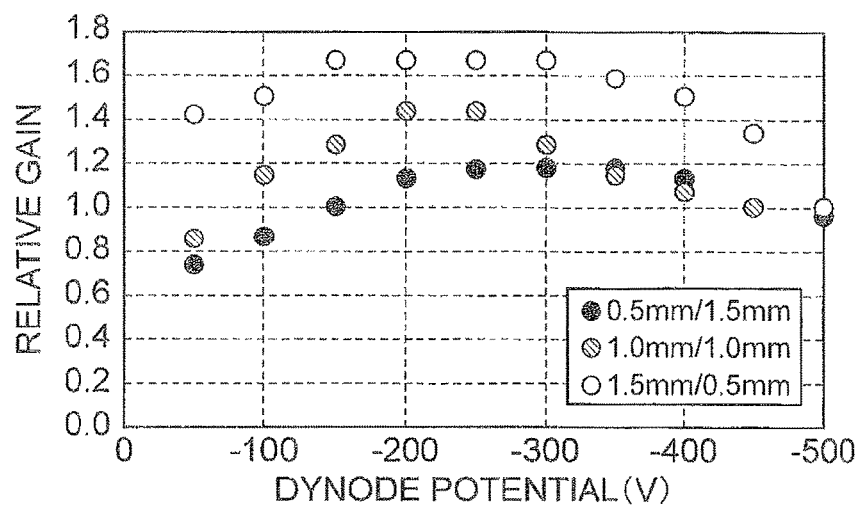
FIG. 6A to FIG. 6C are graphs showing relations between dynode potential and relative gain, which were measured with variation in aperture rate of the anode, in the detector (first structure) shown in FIG. 2A.
Figure 6B:
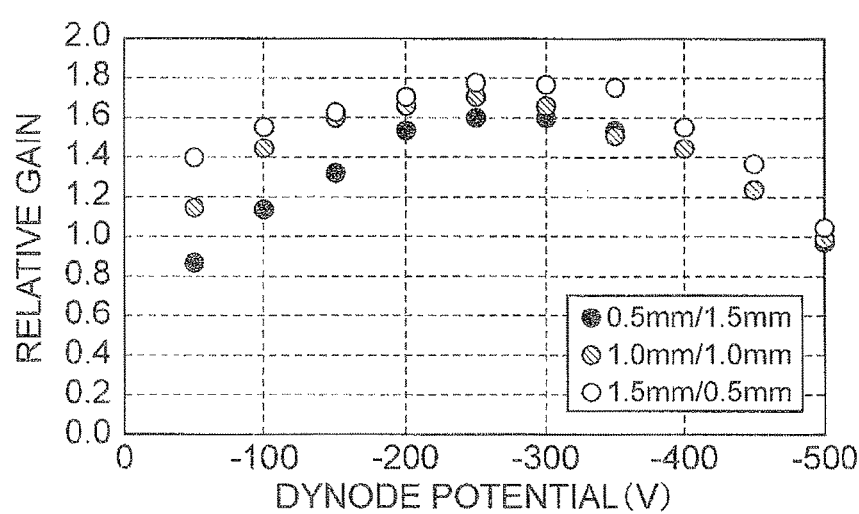
Figure 6C:
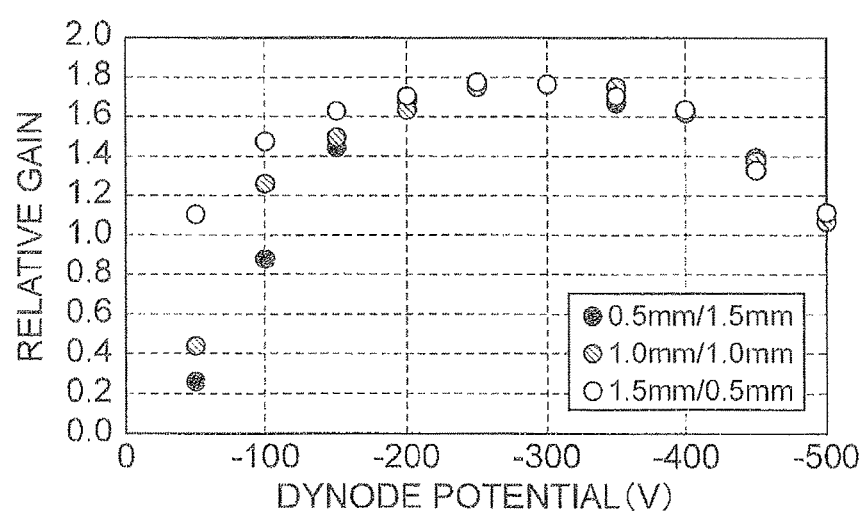

FIGS. 6A to 6C are graphs showing relations between dynode potential V4 and relative gain of the detector 100A, which were measured with variation in aperture rate of the anode 120A. FIG. 6A shows the relation obtained with the aperture rate of the anode 120A of 81%. FIG. 6B shows the relation obtained with the aperture rate of the anode 120A of 90%. FIG. 6C shows the relation obtained with the aperture rate of the anode 120A of 96%. In the detector 100A used in this measurement, the dynode 130A was a SUS plate not coated with the high-δ film. The potential V1 of the MCP input face was −2500V, the potential V2 of the MCP output face −500V, and the potential V3 of the anode 120A 0V (GND potential). The varying potential range of the dynode 130A was from −50V to −500V. Each of FIGS. 6A to 6C shows measured values obtained in each of configuration wherein the distance between the MCP output face and dynode 130A is 2.0 mm and wherein the ratio d1/d2 of the distance d1 between the MCP output face and the anode 120A to the distance d2 between the anode 120A and the dynode 130A is 0.5 mm/1.5 mm, 1.0 mm/1.0, mm, or 1.5 mm/0.5 mm.

As can be seen from these FIGS. 6A to 6C, the relative gain is greater in the case of the distance d2 being 1.0 mm than in the case of the distance d2 being 1.5 mm between the anode 120A and the dynode 130A and the relative gain is much greater in the case of the distance d2 being 0.5 mm. Therefore, the anode 120A is preferably located in the space from the dynode 130A to the intermediate position between the MCP output face and the dynode 130A (or the anode 120A may be located at the intermediate position between the MCP output face and the dynode 130A) because the relative gain can be kept large. The difference in relative gain becomes more prominent as the potential difference between the anode 120A and the dynode 130A becomes smaller or as the aperture rate of the anode 120A becomes smaller. Therefore, the aperture rate of the anode 120A is preferably not more than 90%.

Figure 8A:
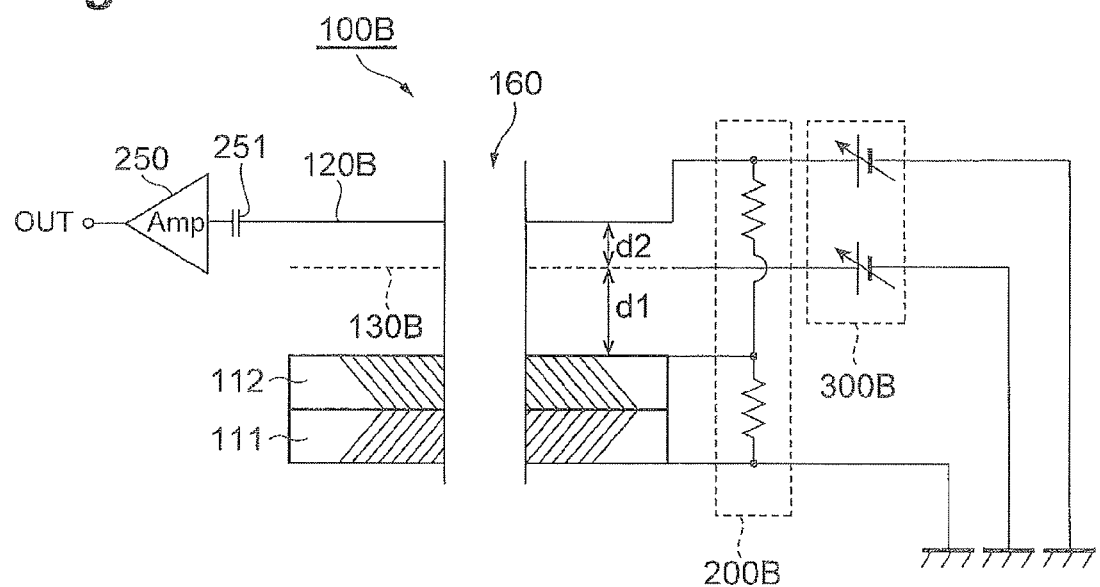
FIGS. 8A and 8B are drawings showing a specific structure for setting electrodes in the detector (second structure) shown in FIG. 7, at respective predetermined potentials and a potential setting state at each of the electrodes.

Next, the detector 100B with the second structure, which is applicable to the SEM 1 in FIG. 1, will be described with reference to FIGS. 7A, 8A-8B, and 9. FIGS. 7A and 8A are drawings showing the configuration of the detector 100B applicable to the secondary electron detector 8 (or reflected electron detector 7) of the SEM 1 in FIG. 1. This detector 100B includes, as the second structure, the MCP laminate consisting of the MCP 111 and MCP 112, an anode 120B, an electrode 130B, and a bleeder circuit 200B connected to an external power supply 300B. The bleeder circuit 200B applies predetermined voltages to the respective electrodes, for forming a potential gradient as in the example shown in FIG. 8B.

In the detector 100B having this second structure, each of the MCPs 111, 112 is a secondary electron multiplier having the structure with a plurality of micro-channels arranged two-dimensionally and independently of each other. Each channel has the inner diameter of about 10 μm and is inclined at about 10° relative to the normal direction to the MCP input face. It is noted, however, that the inclination direction of each channel in the MCP 111 is different from that in the MCP 112. The lead wire 114 extending from the bleeder circuit 200B is connected through the MCP-IN electrode 113 to the MCP input face. Similarly, the lead wire 116 extending from the bleeder circuit 200B is connected through the MCP-OUT electrode 115 to the MCP output face. Namely, the bleeder circuit 200B applies the predetermined voltages to the respective MCP-IN electrode 113 and MCP-OUT electrode 115 through the lead wires 114, 116, whereby the MCP input face and the MCP output face are set at the respective predetermined potentials. The output face is set at the potential higher than that of the input face, whereby the MCP laminate multiplies secondary electrons generated in accordance with arrival of electrons at the input face and outputs the multiplied secondary electrons from the output face.

The anode 120B is disposed on the side where the MCP output face lies (or on the opposite side to the MCP input face with respect to the MCP output face). The bleeder circuit 200B is connected through a lead wire 121B to the anode 120B and, the bleeder circuit 200B applies the predetermined voltage to the anode 120B whereby the anode 120B is set at the potential higher than that of the MCP output face. The anode 120B is a metal flat plate (e.g., a SUS flat plate) arranged in parallel to the MCP output face and is set at the potential higher than that of the MCP output face so as to collect the secondary electrons outputted from the MCP output face. The electric pulse signal outputted from the anode 120B is amplified by the amplifier (Amp) 250. The condenser 251 is disposed between the anode 120B and the amplifier 250, and the condenser 251 has a function keeping a signal output level at the GND level by insulating the output thereof.

The electrode 130B is disposed in parallel to the MCP output face, in a space from the anode 120B to an intermediate position between the MCP output face and the anode 120B. The electrode 130B may be located at the intermediate position between the MCP output face and the anode 120B. The electrode 130B has an aperture for letting the secondary electrons outputted from the MCP output face, pass toward the anode 120B. The electrode 130B is connected to a lead wire 131B and the electrode 130B is set at the potential higher than that of the anode 120B. An aperture rate of the electrode 130B is preferably not more than 90%. Furthermore, the electrode 130B is preferably configured in a mesh shape with a plurality of apertures arranged two-dimensionally.

A through hole is provided in each central region of the MCP laminate (FIG. 7B), the electrode 130B (FIG. 7C), and the anode 120B (FIG. 7D), and then these through holes are inserted with the tube member 160. The electron beam to be incident to the sample 20 passes through an inner space of the tube member 160.

The electrode 130B is sandwiched between the ceramic plate 141 and the ceramic plate 142. The anode 120B is sandwiched between the ceramic plate 142 and the ceramic plate 143. Each of the MCP-IN electrode 113, MCP-OUT electrode 115, and ceramic plates 141-143 has an annular shape. The relative positional relationship among the MCP-IN electrode 113, MCP-OUT electrode 115, and ceramic plates 141-143 is fixed with the screws 151, 152, thereby assembling the detector 100B having the second structure.

In this detector 100B, the electrode 130B and anode 120B are arranged in order along the direction from the MCP input face to the MCP output face. The bleeder circuit 200B applies the predetermined voltages to these respective electrodes through the lead wires 114 (the GND potential in the example in FIGS. 7A, 8A, and 8B), 116, 121B, and 131B (a positive potential in the example in FIGS. 7A, 8A, and 8B) so that the potential of the anode 120B is higher than the potential of the MCP output face and so that the potential of the electrode 130B is higher than the potential of the anode 120B. When an electron arrives at the MCP input face, secondary electrons generated in response to the arrival of the electron are multiplied in the MCPs 111, 112. A large number of secondary electrons thus multiplied are outputted from the MCP output face and accelerated toward the anode 120B by the electrode 130B. As a result, most of the large number of secondary electrons outputted from the MCP output face pass through the aperture of the electrode 130B to be collected by the anode 120B. Namely, when electrons arrive at the MCP input face, the anode 120B outputs the electric pulse signal having a crest value depending on the number of electrons.

Figure 8B:
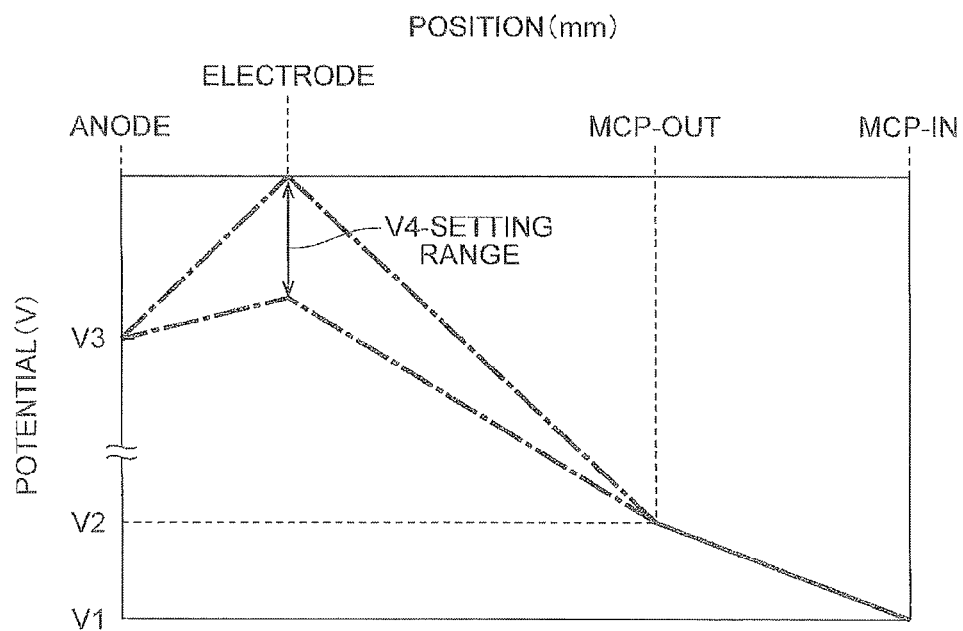

In an example of the potential gradient shown in FIG. 8B, the potential V1 of the MCP input face (MCP-IN electrode 113) is set at 0V (GND potential), the potential V2 of the MCP output face (MCP-OUT electrode 115) is set at +2000V, the potential V3 of the anode 120B is set at +2100V, and the potential V4 of the electrode 130B is set at a positive potential (for, example +2500V) in the range (V4-setting range) exceeding the V2. Regarding the potential gradient from MCP-IN electrode 113 to the anode 120B, as described in the following experimental example, the potential V3 of the anode 120B may be set at 0V (GND potential). In this case, as an example, the potential V1 of the MCP-IN electrode 113 is set at −2300V, the potential V2 of the MCP-OUT electrode 115 is set at −500V, the potential V3 of the anode 120B is set at 0V (GND potential), and the potential V4 of the dynode 130B is set at a positive potential (for example, +500V) in the range (V4-setting range) exceeding the V3.

Figure 9:
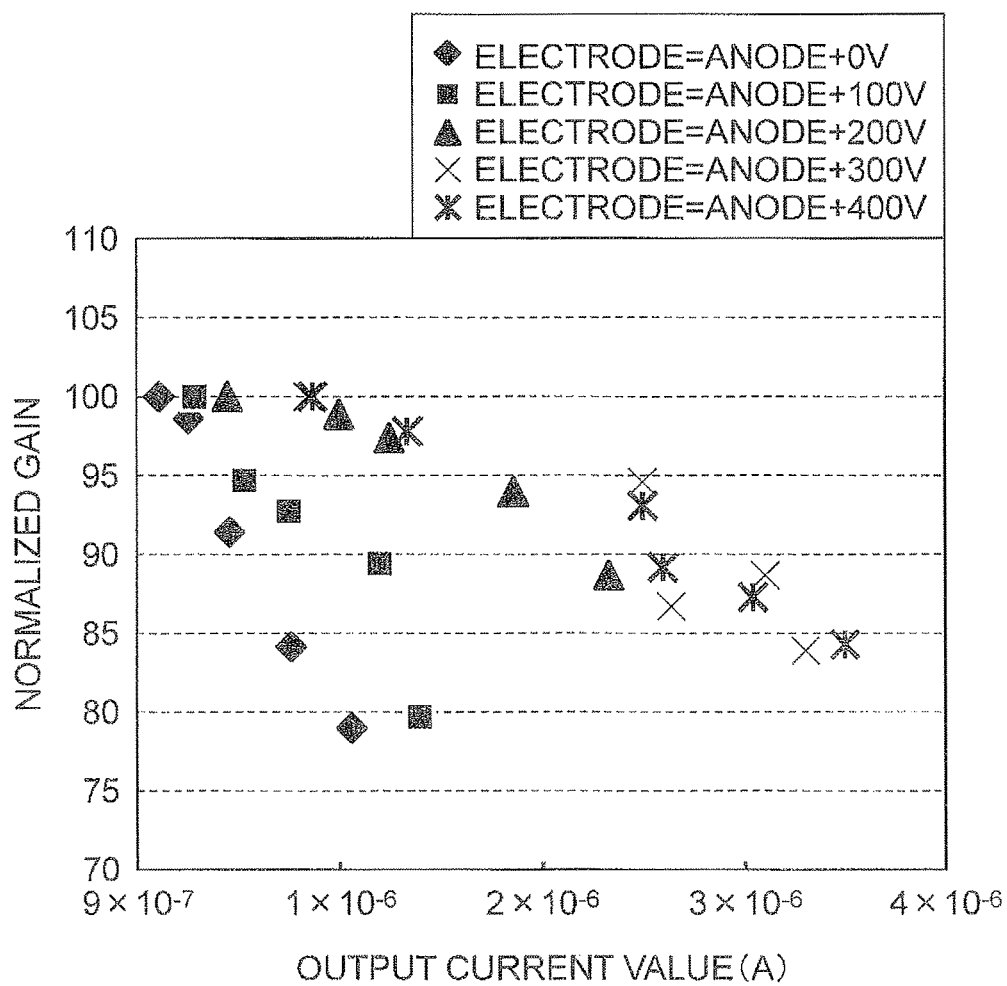
FIG. 9 is a graph showing linearity characteristics of the detector (second structure) shown in FIG. 7.

FIG. 9 is a graph showing linearity characteristics of the detector 100B. The horizontal axis represents the output current value (A) from the anode 120B and the vertical axis the normalized gain. The normalized gain is defined as 100 for the gain at small output current values. In FIG. 9, mark "♦" indicates the linearity characteristic with the potential V4 of the dynode 130B set at the same potential as the potential V3 of the anode 120B, mark "■" the linearity characteristic with the potential V4 of the electrode 130B set at +100V with respect to the potential V3 of the anode 120B, mark "▲" the linearity characteristic with the potential V4 of the electrode 130B set at +200V with respect to the potential V3 of the anode 120B, mark "×" the linearity characteristic with the potential V4 of the electrode 130B set at +300V with respect to the potential V3 of the anode 120B, mark "*" the linearity characteristic with the potential V4 of the electrode 130B set at +400V with respect to the potential V3 of the anode 120B. In the detector 100B used in this measurement, the distance between the MCP output face and the electrode 130B was 1 mm and the distance between the electrode 130B and the anode 120B 1 mm. The anode 120B was a SUS plate. The potential V1 of the MCP input face was set at −2300V, the potential V2 of the MCP output face at −1500V, and the potential V3 of the anode 120B at 0V (GND potential). As can be seen from FIG. 9, the detector 100B with the second structure also expanded the DC linearity by keeping the potential difference between the electrode 130B and anode 120B, for example, not less than 200V. It is understood that the linearity is also expanded by the degree of multiplication of the gain in the detector 100B applied to the present embodiment, compared to the comparative example of FIG. 5.

The detector 100A or the detector 100B with the structure as described above is applied to the detector 8 (or the detector 7) of the SEM 1 of the first embodiment. Therefore, even with increase in amount of incident electrons to the detector 100A or the detector 100B, the gain of the entire detector can be kept large while restraining increase in gain of the MCPs 111, 112. Therefore, the SEM 1 according to the present invention can perform the surface analysis of the sample at a high throughput. Since each of the detector 100A and detector 100B can keep the gain of the MCPs 111, 112 low, the voltage applied between the input face and output face of the MCP laminate can be set low, which improves life characteristics. The detector 100A has a configuration in which the anode 120A is inserted between the MCP laminate and the dynode 130A, and the detector 100B has a configuration in which the electrode 130B is inserted between the MCP laminate and the anode 120B. Therefore, these can suppress increase in scale, compared to the conventional configurations.

From the above description of the present invention, it will be obvious that the present invention may be varied in many ways. Such variations are not to be regarded as a departure from the spirit and scope of the present invention, and all improvements as would be obvious to those skilled in the art are intended for inclusion within the scope of the following claims.

What is claimed is:

1. A scanning electron microscope comprising:
an electron gun for generating an electron beam;
an irradiation unit for irradiating a sample with the electron beam while scanning the sample by moving a position of irradiation with the electron beam on the sample; and
a detector for detecting electrons generated from the sample in accordance with the irradiation of the sample with the electron beam,
wherein the detector includes:
a micro-channel plate for multiplying secondary electrons generated in accordance with incidence of the electrons generated from the sample, the micro-channel plate having an input face located at a position of arrival of the electrons from the sample, and an output face opposing the input face and outputting the multiplied secondary electrons;
a dynode disposed on the opposite side to the input face with respect to the output face and configured to multiply the secondary electrons outputted from the output face, the dynode being set at a potential higher than a potential of the output face; and
an anode disposed in a space from the dynode to an intermediate position between the output face and the dynode and configured to collect the secondary electrons multiplied by the dynode, the anode having an aperture for letting the secondary electrons outputted from the output face, pass toward the dynode, the anode being set at a potential higher than the potential of the dynode.

2. The scanning electron microscope according to claim 1, wherein an aperture rate of the anode is not more than 90%.

3. The scanning electron microscope according to claim 1, wherein the anode has a plurality of apertures arranged two-dimensionally.

4. The scanning electron microscope according to claim 1, wherein the dynode is comprised of a metal flat plate coated with a film to increase a secondary electron emission efficiency.

5. A scanning electron microscope comprising:
an electron gun for generating an electron beam;
an irradiation unit for irradiating a sample with the electron beam while scanning the sample by moving a position of irradiation with the electron beam on the sample; and
a detector for detecting electrons generated from the sample in accordance with the irradiation of the sample with the electron beam,
wherein the detector includes:
a micro-channel plate for multiplying secondary electrons generated in accordance with incidence of the electrons generated from the sample, the micro-channel plate having an input face located at a position of arrival of the electrons from the sample, and an output face opposing the input face and outputting the multiplied secondary electrons;
an anode disposed on the opposite side to the input face with respect to the output face and configured to collect the secondary electrons outputted from the output face, the anode being set at a potential higher than a potential of the output face; and
an electrode disposed in a space from the anode to an intermediate position between the output face and the anode, the anode having an aperture for letting the secondary electrons outputted from the output face, pass toward the anode, the electrode being set at a potential higher than the potential of the anode.

6. The scanning electron microscope according to claim 5, wherein an aperture rate of the electrode is not more than 90%.

7. The scanning electron microscope according to claim 5, wherein the electrode has a plurality of apertures arranged two-dimensionally.

8. The scanning electron microscope according to claim 5, wherein the anode is comprised of a metal flat plate.

* * * * *